United States Patent [19]

Markowicz

[11] Patent Number: 4,919,304

[45] Date of Patent: Apr. 24, 1990

[54] BUBBLER CYLINDER DEVICE

[75] Inventor: Marion Markowicz, Basking Ridge, N.J.

[73] Assignee: American Cyanamid Company, Stamford, Conn.

[21] Appl. No.: 202,166

[22] Filed: Jun. 3, 1988

Related U.S. Application Data

[63] Continuation-in-part of Ser. No. 761,470, Aug. 1, 1985, abandoned.

[51] Int. Cl.$^5$ .................................................. B67B 7/24
[52] U.S. Cl. ........................................ 222/3; 222/630; 222/394; 222/399; 222/400.7; 222/481
[58] Field of Search .................. 222/3, 630, 394, 399, 222/400.7, 481; 261/124, 121 R

[56] References Cited

U.S. PATENT DOCUMENTS

| 2,443,981 | 3/1945 | Funk et al. | 222/259 |
| 3,454,199 | 7/1969 | malick | 222/400.7 |
| 3,869,771 | 3/1975 | Bollinger | 261/124 X |
| 4,473,174 | 9/1984 | Heuser | 222/152 |
| 4,506,815 | 3/1985 | Melas et al. | 222/630 |

Primary Examiner—Michael S. Huppert
Assistant Examiner—Boris Milef
Attorney, Agent, or Firm—Gordon L. Hart; William H. Calnan

[57] ABSTRACT

A cylinder assembly which may incorporate a dip tube when used, for example, as a vapor transfer device of electronic grade organometallic liquids to a deposition system but can also be used for storing and dispensing liquids and gases. In case of vapor transfer, the device preferably includes one self-closable filling port inlet, one gas inlet valve and one outlet vapor valve. The dip tube extends downwardly into a cylindrical container.

1 Claim, 3 Drawing Sheets

BUBBLER CYLINDER DEVICE

This is a continuation-in-part of my copending U.S. patent application Ser. No. 761,470, filed Aug. 1, 1985, now abandoned.

BACKGROUND OF THE INVENTION

1. Field of Invention

Although it may be used for other purposes, this invention relates primarily to bubbler devices for transferring electronic grade organometallic compounds from a container having such compounds therein to a deposition system, for example, a chamber wherein crystalline or other substances are being grown on substrates or are otherwise being treated by a process known as "doping" in production of products such as semiconductor elements or monolithic circuits.

2. Description of Prior Art

It is known in the prior art to use a bubbler technique for transferring, by vapor deposition, doping compounds in liquid form from a source of such compounds, e.g., a non-refillable cylindrical cartridge, to a deposition system. Such bubbler technique involves the introduction, through an inlet valve and a dip tube, to the bottom of the cylinder, of a gas (such as hydrogen) which is inert to the doping compound. In bubbling up through the doping compound, molecules of the compound intermingle with those of the gas. The gas, saturated with the vapor of the compound, flows out through the outlet valve where it enters the deposition system. It has generally been the practice in the prior art to use bellows seal valves for both the inlet and outlet valves.

Bubbler cylindrical cartridge and dip tube assemblies including inlet and outlet valves, as mentioned above, are commercially available, a typical example being the assembly manufactured and sold by Thiokol/Ventron Division Alfa Products, 152 Andover Street, Danvers, Mass. 01923. These prior art cylindrical cartridge and dip tube assemblies are characterized in that they are intended to protect the organometallic compounds during shipment and storage as well as to provide a method for dispensing the compound to a deposition system.

A number of problems with such bubbler assemblies or devices have been encountered in the prior art. Not only are the organometallic compounds easily contaminated, but they are also prone to leakage. This situation has been aggravated in the prior art by the shape and arrangement of the cylindrical cartridge or cylinder, the bottom portion having a generally oval shape narrowing down to size of an opening that is provided for filling the cartridge and which is closed by a threaded plug. Such cylinders thus have the disadvantage of not being stable in an upright position and also of having a tendency to leak in the upright as well as other positions. The narrowing or oval shape of the lower portion of the prior art cartridges has a further disadvantage in that it detracts from an overall average consistency or uniformity in the rate of transfer of the organometallic vapour from the cartridge to the deposition system. The reason for this is that the volume of the liquid through which the continuing flow of the bubbles rise to become saturated with the organometallic vapor diminishes as the level of the liquid drops.

Since the organometallic compounds are very costly, such contamination, leakage, and the inability to utilize uniformly the complete contents of the cartridge added significantly to the cost and reduced the efficiency of the doping procedures.

One attempt to overcome the disadvantages of the prior art devices hereinabove described is disclosed in U.S. Pat. No. 4,506,815, issued Mar. 26, 1985 (Melas et al.), wherein an all welded cylinder and dip tube package utilizing diaphragm valves at each of the inlet and outlet valves and having the interior of the cylinder and the interior and exterior of the dip tube provided with a coating of a material which acts as a barrier to the contamination of the organometallic liquid by the metal is described. Specifically, the device described in said patent comprises pipe connections between the inlet and outlet openings of the top closure portion of the device and the diaphragm valves which control passage of gas into the cylinder and passage of the gas saturated with the organometallic compound vapors out of the cylinder, respectively, the pipe connections being sealed by welding. Although the device disclosed in the said patent represented an improvement over prior art devices in the bubbler device art, problems are associated with it as well. In particular, since the valves extend outwardly from the top closure portion of the device in a wing-like manner, there exists the potential for cracking of the pipe welds during handling, for example, presenting the possibility of leakage.

SUMMARY OF THE INVENTION

An object of the invention is to provide an improved and safer bubbler device for use in the doping of products such as semiconductor materials and monolithic circuits with electronic grade high purity organometallic compounds in which the aforementioned problems of the prior art are further minimized or eliminated by the inclusion of the inlet and outlet valve means in the top closure portion of the bubbler device, thereby eliminating the pipe welds employed by Melas et al.

Another object of the invention is to provide such a device wherein the cylinder may be filled through a filling port in the top closure portion (hereinafter sometimes, for convenience, referred to as the "block") of the assembly, thus leaving the hydrogen and vapor valves untouched when filling. Another object of the invention is to provide for such a device a filling port which is self-closing, thus preventing any contamination during the filling process, or otherwise, of the electronic grade organometallic compounds through the filling port area.

Another object of the invention is to provide such a device containing only one weld exposed to the outside which, inclusive of the inlet and outlet valves, may be completely sealed after being filled with the electronic grade organometallic liquid compounds, until fully installed between the gas source to be used for bubbling and a deposition system.

Another object of the invention is to provide absolute safety during transportation and storage by providing the fillport inlet port and outlet port with VCR metal to metal plugs, thereby further minimizing the possibility of leakage through a valve being inadvertently opened, the plugs being removed only by a special tool. Another specific object of the invention is to provide an assembly capable of withstanding high pressures so as to reduce the possibility of accident due to an unforseen increase in temperature.

Another object of the invention is to eliminate any assembly by, for example, welding of standard components such as valves, tubing, quick disconnects, etc., and to incorporate these required components in the block of the device using available, standard and well-proven manufacturing technology.

Another object of the invention is to provide the end of the dip tube with a plurality of openings to produce a plurality of fine bubbles, thereby achieving a more effective saturation of the gas bubbles with the vapor of the organometallic compound.

Still another object of the invention is to provide such a device by the combination of a block of material incorporating one or more valves, a filling port, with or without a dip tube, which device can be used for liquids, vapors and gases up to a working pressure on the order of 1,800 psig or higher if desired.

In accomplishing these and other objectives of the invention, there is provided a cylinder and dip tube package suitable for containing electronic grade organometallic compounds in liquid form such as, for example, diethyltelluride- diethyl zinc, dimethyl mercury, dimethyltelluride, and other group II, III, V and VI metal alkyls. The package comprises a stainless steel block welded to a stainless steel cylindrical container, and a dip tube, the block having incorporated therein inlet and outlet valves and a fillport and providing direct connections to a source of gas, such as hydrogen, that is inert to the organometallic liquid and to a deposition system. In accordance with the invention, the inlet and outlet valves may be of any type, such as diaphragm, bellows or the like, provided that, when closed, there is a complete seal of, for example, the electronic grade organometallic material in the cylindrical container. The device may be so designed that it will remain upright, the self-sealing filling port and all valve connections to outside sources being securely sealed with metal to metal connection plugs, so-called "VCR plugs". The possibility of the highly reactive and costly organometallic material being able to leak is thereby greatly minimized.

Advantageously, the device of the instant invention may have the interior of the refillable cylinder and the dip tube therein electropolished or provided with a suitable coating to serve as a barrier to contamination of the material contained therein, such as electronic grade organometallic liquid compounds, by the material of construction of which the cylinder and dip tube are made.

Still further, the device of the invention may be provided with an improved shape of cylinder, one wherein the outside diameter is constant throughout its entire length with the length and diameter varying according to size requirements to achieve a high aspect ratio (EO up to 150 cc OD 1.5" above 150 cc OD 2") to provide for a more effective saturation of the gas bubbles with the vapor of organometallic compound.

In a preferred embodiment of the invention, such a device is provided with a diaphragm valve at each of the inlet and outlet passages, such valves being characterized as being one quarter turn packless, and being capable of withstanding high pressures and having a relatively small area exposed to the electronic grade organometallic compound vapor. Other valves can be used, e.g. packed needle valves (Autoclave and others), packless bellows valves (Hoke and others). In case of packless diaphragm or bellows valves, they may be hand or pneumatically operated, the pneumatic valves having a fail closed feature.

The interior of the device may be electropolished and/or may, if necessary, be coated with TEFLON ®, noble metal, PBN or other suitable materials, if a barrier to contamination of, e.g., the organometallic liquid by the metal in contact with said liquid is necessary.

In a preferred embodiment of the invention, the dip tube may be suitably machined at its lower end to provide a plurality of openings, for example, cut up into the sidewalls thereof such that a plurality of small gas bubbles exits from the dip tube. The shape of the opening(s) may be varied to suit requirements which might differ with various materials to be used. Alternatively, the bottom portion of the dip tube may be sintered, resulting in a plurality of openings therein of small diameter. A still further alternative is to seal the lower end of the dip tube and provide one or more small openings therein and/or in the lower portion of the dip tube. In yet another embodiment, the dip tube extends to the bottom of the cylinder and one or more openings are provided in the lower portion of the dip tube. Further, in accordance with the invention, the dimensions of the cylindrical container may be changed in diameter and/or length to provide an optimum aspect ratio for the production of saturated vapor of, for example, electronic grade organometallic liquids.

Further, in accordance with the invention, a one valve and fillport-containing block is provided for use in a cylinder/block assembly where no inlet of "bubbling" material is needed, as, for example, where the material in the cylinder will exit the device without the use of a gaseous carrier. Examples of such materials would include phosphine, arsine, silane, hydrogen cyanide. The Figures represent a preferred embodiment of such a device, with the exception that such a device would not include the dip tube, nor any of the components associated with the gas inlet portion of the device shown in the Figures.

BRIEF DESCRIPTION OF THE DRAWINGS

Having summarized the invention, a detailed description follows with reference being made to the acccompanying drawings, which form part of the specification, of which FIG. 1 a schematic illustration, substantially in cross section, taken along line A—A of FIG. 2 as to the block portion of the assembly, of an embodiment of the device of the present invention.

DESCRIPTION OF THE PREFERRED EMBODIMENT

Figure 1:
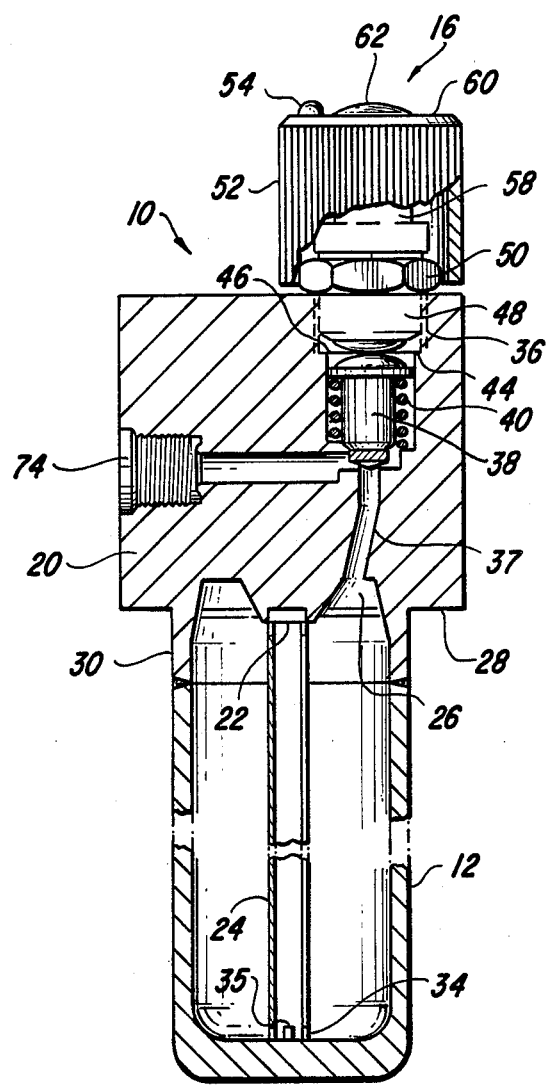
Figure 2:
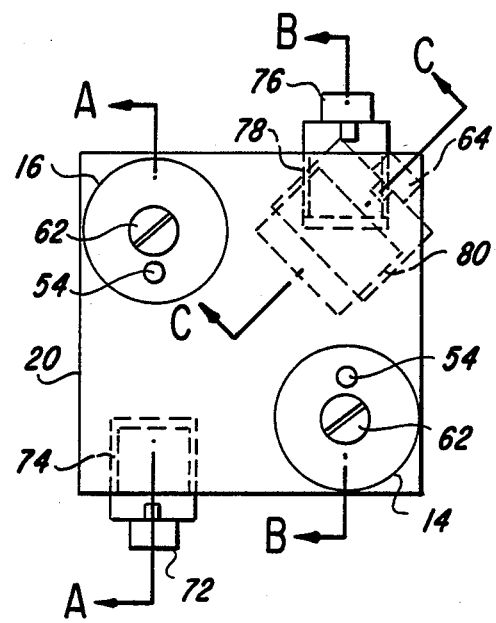
FIG. 2 is the top plan view of one embodiment of the device of the instant invention.
Figure 3:
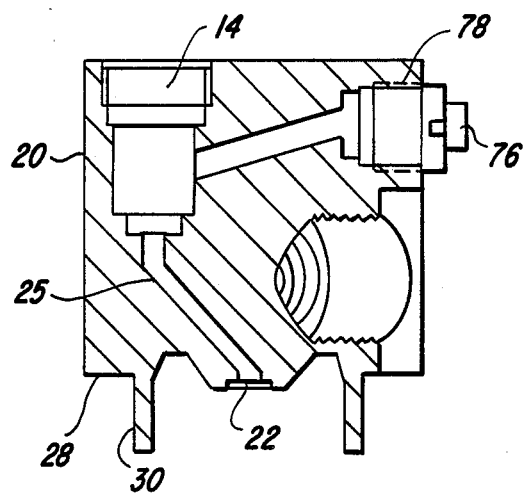
FIG. 3 is a cross section of the block taken along line B—B of FIG. 2, showing details of one embodiment of the gas inlet valve (with valve components removed).

There is provided in a preferred embodiment of the invention illustrated in FIGS. 1-4 a cylindrical container and dip tube device for transferring, e.g., electronic grade organometallic material contained within the container to an adjacent deposition system, not shown, wherein crystalline substances are being processed into electronic semiconductor elements or monolithic circuits. The container and dip tube package indicated generally by the reference numeral 10 includes a vertically disposed closed cylinder or container 12, controllable vapor outlet diaphragm valve means 16 (FIGS. 1 and 2), controllable gas inlet diaphragm valve means 74 (FIGS. 2 and 3) and a self inlet port means 18

(FIG. 4) being incorporated into the block which serves as the top closure portion of the device. The cylinder 12 is preferably made of one piece of material. It may, however, comprise an assembly of tube and suitably manufactured bottom closure, and preferably has a uniform inside and/or outside diameter throughout its length.

The block 20, FIG. 1, may be made by machining, stamping or any other well-known method, of one solid piece of material (preferably, 316L Stainless Steel) and incorporates therewithin a gas inlet valve 14, vapor outlet valve 16 and fillport 18. The lower surface of block 20 is suitably shaped so that it fits snugly against the upper surface of cylinder 12 to ensure a weld which will guarantee integrity, which welding is preferably performed automatically to give highest weld quality. In a preferred embodiment, an integral depending cylindrical skirt 30 extends downwardly from the bottom surface of the block to align with the cylinder, so the weld will not be immediately adjacent the block, thereby facilitating an X-ray inspection of the weld. Block 20 at its bottom surface inside the container preferably has a generally concave configuration at the opening for the electronic grade organometallic vapor to minimize any entrapment of said vapor and reduce the potential of any vapor traces to remain in the cylinder. Said block is preferably substantially cubic in shape to enable it to be clamped for purposes of inserting and removing metal to metal (VCR) plugs, securing all external ports or other metal to metal fittings and preferably has ledge 28 at its bottom surface outside the container for securing the assembly in a vertical position. It is to be understood, however, that the shape of the block is not critical and may be of any shape without departing from the scope of the instant invention. Block 20 at its bottom surface inside the container has a suitable opening 22, into which fits the hollow dip tube 24 which is permanently attached, e.g. by welding, by securing with a thread, by pinching or other equivalent means, the said block preferably being so made that the exit opening 26 is at the very highest point on the inside of the cylinder. This may be accomplished, for example, by providing a concave area on the lower surface of the block 20 at the position of opening 26. The said block 20 constitutes the top closure portion of the cylinder 12. Opening 22, to which the dip tube 24 is connected, is the end of passage 25 which extends through the block to valve 14. Opening 26 is the end of passage 37 which, in turn, connects to outlet valve 16. Opening 32 leads to the self closable fillport 18. The dip tube 24 which is attached to block 20 by, for example, welding at opening 22 is of such length as to nearly reach, and in a preferred embodiment preferably contacts, optionally in a sealing manner, the interior surface of the bottom of the cylinder. The dip tube end 34 may be suitably notched to produce one or more relatively small openings 35 in the wall of the tube near the bottom. The shape, size and number of notches may vary according to requirements. The inlet gas valve 14 and outlet vapor valve 16 are preferably identical in detail and are shown in the preferred embodiment as standard hand operated packless diaphragm valves as manufactured by Ewal Manufacturing Company, Inc., 41 Montgomery Street, Belleville, N. J. 07109. Such a valve is indicated as 16 in FIG. 1 and is substantially a part of the block 20, fitting into internally threaded recess 36. A valve plug 38 is upwardly biased by a compression spring 40 and is so positioned when the valve is in open position that there is no obstruction to flow of gas from the cylinder through port 26 into passage 37 which extends to the recess 36 and thence through the open valve to outlet port 74.

The diaphragm 46 rests on shoulder 44 of internally threaded recess 36. The stem 58, which is externally threaded, screws into the threaded recess 36 and has a hexagonal portion 50 which is used for the final securing of the diaphragm to seal the recess between the stem outside the diaphragm and a valve plug 38 inside the diaphragm in the recess. Although, as shown in the Figures, the valves are vertically disposed in the block, either or both may be tilted at any angle and/or may be at the same height, depending upon requirements. The stem is operated by a knob 52 which has an indicator 54 showing the position of the valve. The valve is assembled by exerting the required amount of torque on the bushing 48 via the hexagonal portion 50 to seal the diaphragm in the recess to achieve a leak free assembly. A lock wire (not shown) may be inserted in holes in the block 20 and the hexagonal portion of the stem 50 and sealed with an appropriate seal. This type of assembly does not require the diaphragm 46 to be welded to the block 20 to ensure "leak proof" assembly within the block. When the stem 58 is appropriately rotated, the diaphragm 46 is pushed downwards thus compressing the spring 40 and valve plug 38 inside the diaphragm to close the passage 37.

Figure 4:
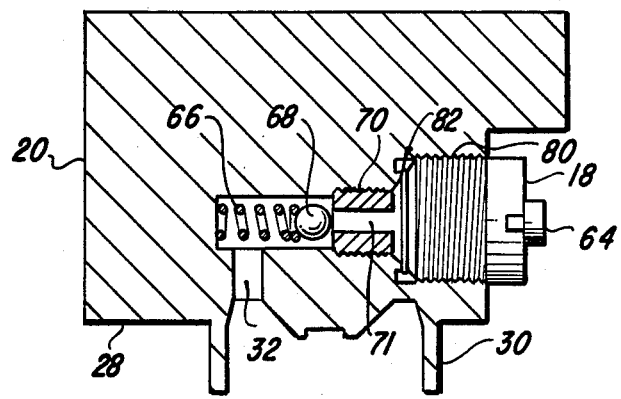
FIG. 4 is a cross section of the block taken along line C—C of FIG. 2 showing one embodiment of the fillport.

The knob 52 is secured to the stem 58 by a spline (not shown) and washer 60 and set screw 62. The fillport 64 which is within block 20 is connected to opening 32 via compression spring 66 and ball 68 resting against an elastomer seat 70. During the filling operation, the spring is compressed as the ball is pushed away from the seat by force of liquid entering through passage 71. Suitable sniff holes (not shown) may be provided at each valve and every port connection. The gas port connection 78, vapor port connection 74 and fillport connection 80 are plugged with plugs 76, 72 and 64 respectively, the plug design being the same as shown in FIG. 4 for the fillport plug. The plugs are standard metal to metal connections via a washer 82 trapped between two convex surfaces as manufactured, for example, by Ewal Manufacturing Company, Inc., 41 Montgomery Street, Belleville, N. J. 07109 (so-called "VCR plugs"). A special type of socket wrench may be used both to apply appropriate torque for sealing and for removing, thereby ensuring a virtually tamper-proof arrangement.

In a preferred embodiment of the device of the instant invention, the gas and vapor passage lengths are kept to a minimum. Together with the preferred use of diaphragm valves which have an inherently small inner space or volume, the total volume of these passages is minimized, thus reducing the possibility of contamination of, for example, the organometallic vapor. All of the internal surfaces of the assembly, including valves, gas and vapor passages, dip tube and cylinder are preferably electropolished. If desired, the cylinder and dip tube may be coated by any suitable coating, e.g., TEFLON ®, noble metal, PBN and the like.

In the operation of the device of the instant invention, when operatively installed and connected at connection 78 to a gas source and at connection 74 to a processing chamber, turning of the knob controlling the gas inlet valve 14 opens the valve allowing the carrier gas, such as hydrogen or another gas inert to the organometallic liquid and the crystal products being processed in the deposition system, to enter the interior of cylinder 12 through the connection 78 and passage 25, passing the valve and proceeding through dip tube 24. At the bottom of dip tube 24, gas escapes through slots 35, creating a continuous flow of bubbles which rise through the organometallic liquid some of which vaporizes and is carried with the gas upwardly above the level of the organometallic liquid and then out through opening 26 and through outlet valve 16, which has also been opened by the appropriate rotation of its control knob.

Thus, in accordance with the invention, there has been provided a cylinder dip tube package including a block as a top closure portion having incorporated therein gas inlet and vapor outlet valves, and optionally, a self-closing filling port, said block being attached by welding to a dip tube and then to a cylinder, the inlet and outlet valves and the block presenting a very small and inert volume to the vapor or liquid, with the block having a ledge for positioning of the assembly in an upright position. The assembly, with all valves inside the block shut, and with plugs secured in the fillport and in the external inlet and outlet ports, provides a virtually leak-proof and tamper-proof device which may be safely shipped or stored with double seals in each passage leading from inside the container. Further, in accordance with the invention, the shape of the cylinder 12 may be selected to provide a high aspect ratio, i.e. length relatively great in comparison to outside diameter. The cylinder may be made, for example, by machining out of solid material, metal forming by pressing, or spinning from sheet metal or other hot or cold forming techniques or by welding an appropriate bottom to a tube, all such techniques being well known to those skilled in the art. The cylinder may also be constructed such that it has a constant outside diameter with a good finish and that the outside surface can be coated or modified, for example, to enhance heat transfer.

I claim:

1. A bubbler device for storage and delivery of electronic grade organometallic compounds, said device comprising a cylinder closed at its bottom and welded at its top rim to a cylindrical skirt member of a single block to form a container of which said block is the top closure portion, separate recesses in said block, each recess opening to an outer surface of said block and, within the first said recess, valve means for controlling inlet of gas into said container, and within another of said recesses valve means for controlling outlet of gas from inside said container, a first passage extending through said block from an inlet port at an outer surface of said block to said first recess and continuing from said first recess through the block to a first opening at the surface of the block inside said container, a second passage extending through said block from an outlet port at an outer surface of said block to said second recess and continuing from said second recess through the block to a second opening at the lower surface of the block inside said container, said second opening located within a recess of said lower surface such that said second opening is at the highest point within said container, each of said valves in said first and second recesses being controllable from outside said block between open and closed positions for controlling flow of gas through said first and second passages respectively, each of said valves in its recess comprising a diaphragm which seals the recess between a valve stem outside said diaphragm and a valve plug inside said diaphragm in said recess, a dip tube inside said container fitted to said first opening in the block at the inner end of said first passage, said dip tube extending downward from said first opening to the bottom of said container and at least one slot or opening at or near the lower end of said dip tube for passage of gas from the dip tube into the container, the inner surfaces of said container and said dip tube being either electropolished or coated with a protective coating to provide a barrier to contamination of the contents by the metal of said container and dip tube.

* * * * *